US008071896B2

United States Patent
Abe et al.

(10) Patent No.: US 8,071,896 B2
(45) Date of Patent: Dec. 6, 2011

(54) SWITCH DEVICE GENERATING ANALOG OUTPUT WITH CLICK MECHANISM

(75) Inventors: Rinji Abe, Miyagi-ken (JP); Yuya Kikuchi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 373 days.

(21) Appl. No.: 12/395,866

(22) Filed: Mar. 2, 2009

(65) Prior Publication Data
US 2009/0223792 A1 Sep. 10, 2009

(30) Foreign Application Priority Data
Mar. 6, 2008 (JP) ................................. 2008-055730

(51) Int. Cl.
*H01H 13/70* (2006.01)
(52) U.S. Cl. ........................................................ 200/5 R
(58) Field of Classification Search .................. 200/6 A, 200/5 R, 329, 237, 512, 517
See application file for complete search history.

(56) References Cited

U.S. PATENT DOCUMENTS

| 5,446,253 | A | 8/1995 | Oshgan | |
|---|---|---|---|---|
| 5,555,004 | A * | 9/1996 | Ono et al. | 345/161 |
| 6,313,731 | B1 * | 11/2001 | Vance | 338/185 |
| 6,694,236 | B2 * | 2/2004 | Onodera | 701/36 |
| 2008/0067041 | A1 * | 3/2008 | Osada | 200/6 A |
| 2008/0223706 | A1 * | 9/2008 | Hagiwara et al. | 200/5 A |
| 2010/0147663 | A1 * | 6/2010 | Yamada | 200/329 |

FOREIGN PATENT DOCUMENTS

| DE | 41 26 318 A1 | 2/1993 |
|---|---|---|
| EP | 0 797 302 A1 | 9/1997 |
| JP | 2005-019100 | 1/2005 |

OTHER PUBLICATIONS

European Search Report issued in corresponding European Patent Application No. 09 00 2212; issued Jul. 3, 2009.

* cited by examiner

*Primary Examiner* — Edwin A. Leon
(74) *Attorney, Agent, or Firm* — Brinks Hofer Gilson & Lione

(57) ABSTRACT

A switch device includes an electrical component having an operating unit and outputting a predetermined analog signal based on a position of the operating unit, and a detecting unit that detects operation of the operating unit on the basis of an output from the electrical component. The electrical component is provided with a click mechanism that generates a click feeling at a predetermined position with respect to the operation of the operating unit, and the click mechanism shifts the operating unit while changing an operating speed at the predetermined position. The detecting unit detects variation in output from the electrical component, and outputs a predetermined signal on the basis of the variation in output by considering that the operating unit is at a predetermined position for generating the click feeling.

5 Claims, 5 Drawing Sheets

SWITCH DEVICE GENERATING ANALOG OUTPUT WITH CLICK MECHANISM

CROSS REFERENCE TO RELATED APPLICATIONS

The present application contains subject matter related to and claims priority to Japanese Patent Application No. 2008-055730 filed in the Japanese Patent Office on Mar. 6, 2008, the entire contents of which is incorporated herein by reference.

BACKGROUND

1. Technical Field

The present invention relates to a switch device that outputs an ON or OFF signal at a predetermined operating position on the basis of an analog output from an electrical component, and more particularly, to a switch device having a click mechanism.

2. Related Art

As a switch device, there is a type that outputs an ON or OFF switching signal by contact and separation between a movable contact point and a fixed contact point, and a type that outputs an ON or OFF switching signal when an analog output exceeds a predetermined threshold value. Such a switch device has a click mechanism for generating a click feeling when an operating unit is at a predetermined position.

When the switch device is used as a switch device for opening and closing a power window, the switch device is disposed at an elbow support of a door in a vehicle, and an operating unit can be rocked in a pulling direction and a pushing direction from a neutral position. When the operating unit is operated in the pulling direction, the window is moved upward, that is, in a closing direction. When the operating unit is operated in the pushing direction, the window is moved downward, that is, in an opening direction.

The click mechanism of the switch device is configured to generate 2-step click feelings in the pulling direction and the pushing direction at the time of operating the operating unit. The switch device gives an instruction of a manual operation (window of vehicle goes up or down only during operation) at the first-step click position, and gives an instruction of an automatic operation (window continues to go up or down even after operation) at the second-step click position. To properly give an instruction, it is necessary to securely synchronize the time of the ON or OFF switching signal and the click position of the switch device.

In the switch device of a type that outputs an ON or OFF switching signal when an analog output exceeds a predetermined threshold value, there has been known a magnetic detection method using a permanent magnet rocked in association with the operating unit and a magnetoresistive element having electrical resistance varied with variation of magnetic field caused by movement of the permanent magnet. According to the magnetic detection method, it is possible to prevent decreases of reliability caused by the attachment of dust, or oxidation or wear of a contact point, as compared with the switch device of the type which contacts or separates a movable contact point and a fixed contact point.

In this case, the output from the magnetoresistive element is varied with the variation of the operation position of the operating unit. The output value is detected by a detecting unit. When the output value exceeds a predetermined threshold value, it is considered that the operating unit has operated by a predetermined degree and an ON signal is output. In addition, to notify an operator of the operation of the predetermined degree when the output value exceeds the predetermined threshold value, a click mechanism is provided to generate a click feeling at that position. However, the output voltage value from the magnetoresistive element varies by variations in temperature, and the relationship between the position of the operating unit and the output voltage value also varies when there is a deviation of completion of each switch device. In this case, the output time of the ON signal and the click position may deviate from each other. In such a case, the click mechanism provided to notify the operator of the ON position may result in confusion for the operator.

To solve the problem, it has been known that an output voltage value at the time of actually operating an operating unit at a click position is stored in a memory and the output voltage value is used as a threshold value. According to this method, it is possible to absorb differences of individual deviation. Such a switch device, for example, is described in Japanese Patent Application Laid-Open No. 2005-19100.

However, in the known switch device, an output voltage value that is a threshold value at the actual using time is not set. Accordingly, although it is possible to absorb the individual deviation, it is difficult to cope with variation in characteristic at the actual using time, that is, variation in relationship between the position of the operating unit and the output voltage value according to variation in temperature. For this reason, the position for detecting the position of the operating unit with the detecting unit and the click position in the operating unit may deviate from each other, and it may be difficult to synchronize the time when the switch device outputs a signal and the time when a click event occurs.

SUMMARY

A switch device includes: an electrical component having an operating unit and outputting a predetermined analog signal based on a position of the operating unit; and a detecting unit for detecting operation of the operating unit on the basis of an output from the electrical component, wherein the electrical component is provided with a click mechanism that generates a click feeling at a predetermined position with respect to the operation of the operating unit, and the click mechanism shifts the operating unit while changing an operating speed at the predetermined position, and wherein the detecting unit detects variation in output from the electrical component, and outputs a predetermined signal on the basis of the variation in output by considering that the operating unit is at a predetermined position for generating the click feeling.

DESCRIPTION OF EXEMPLARY EMBODIMENTS

Figure 1:
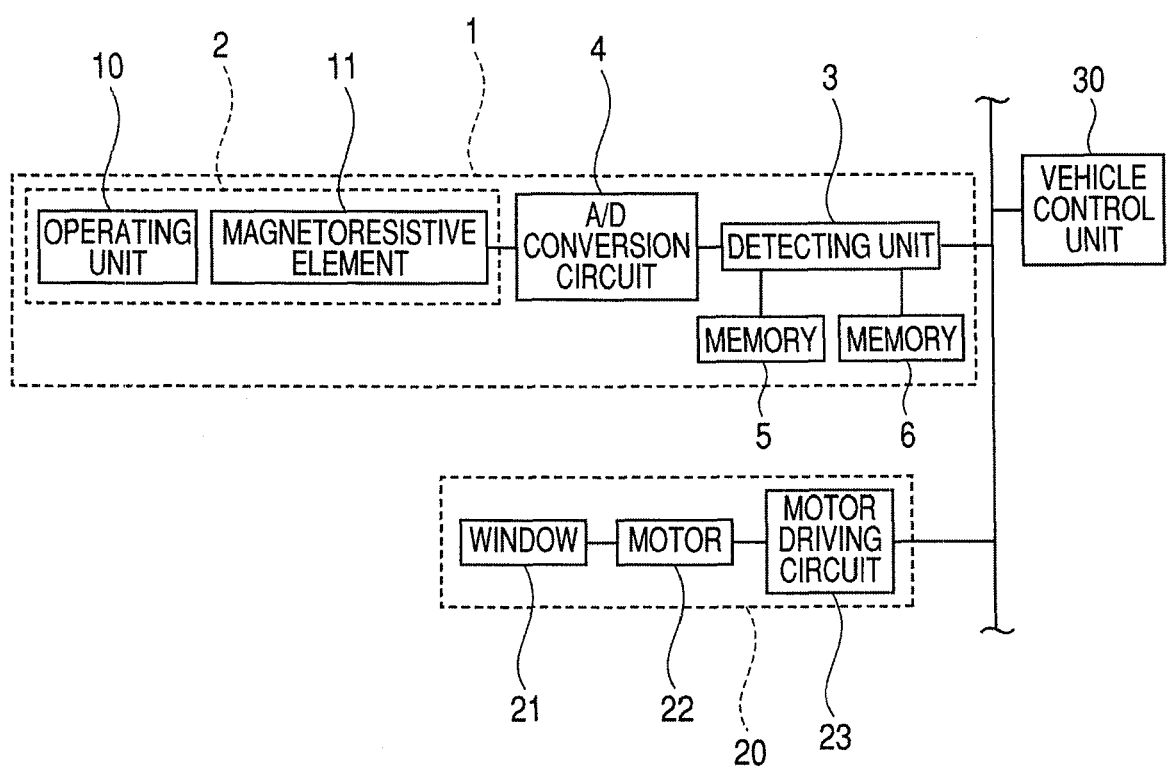
FIG. 1 is a block diagram illustrating a system in a vehicle including a switch device according to an embodiment.

An embodiment of the invention will be described in detail with reference to the drawings. A switch device according to the embodiment is provided to open and close a power window for a vehicle. FIG. 1 shows a block diagram of a system in a vehicle including a switch device 1 according to the embodiment. As shown in FIG. 1, as a configuration for opening and closing the power window, the switch device 1 and a window device 20 are provided in a vehicle, and they are connected to a vehicle control unit 30 through a communication path 31.

When the vehicle control unit 30 receives a signal of a predetermined operation from the switch device 1, the vehicle control unit 30 controls the window device 20 to move up or down the window 21. The communication path 31 connects various devices in the vehicle in addition to the switch device 1 and the window device 20, and the vehicle control unit 30 also controls the various devices.

The switch device 1 has an electrical component 2 operated by a user and a detecting unit 3 for detecting an operation of the electrical component 2. Since an analog signal is output from the electrical component 2, an A/D conversion circuit 4 is provided between the electrical component 2 and the detecting unit 3, and the signal output from the electrical component 2 is converted into a digital signal and is output to the detecting unit 3.

The electrical component 2 has an operating unit 10 operated by the user, and a magnetoresistive element 11 having an output based on the position thereof in non-contact with the operating unit 10. The output from the electrical component 2 is formed from the magnetoresistive element 11, and the output is sent to the detecting unit 3 through the A/D conversion circuit 4, as described above.

The detecting unit 3 is connected to a first memory 5 and a second memory 6. The first memory 5 is formed of a RAM that is readable and writable by the detecting unit 3, and temporarily stores the output from the electrical component 2 or the detected state of the operation unit 10. The second memory 6 is formed of a ROM that is only readable from the detecting unit 3, and data for detecting the state of the operating unit 10 in the initial state is previously written in the second memory unit 6.

The window device 20 includes a window 21 moved up and down, a motor 22 for moving up and down the window 21, and a motor driving circuit 23 driving the motor 22 in a predetermined direction. The motor driving circuit 23 operates the motor 22 by an instruction from the vehicle control unit 30 connected through the communication path 31.

Figure 2:
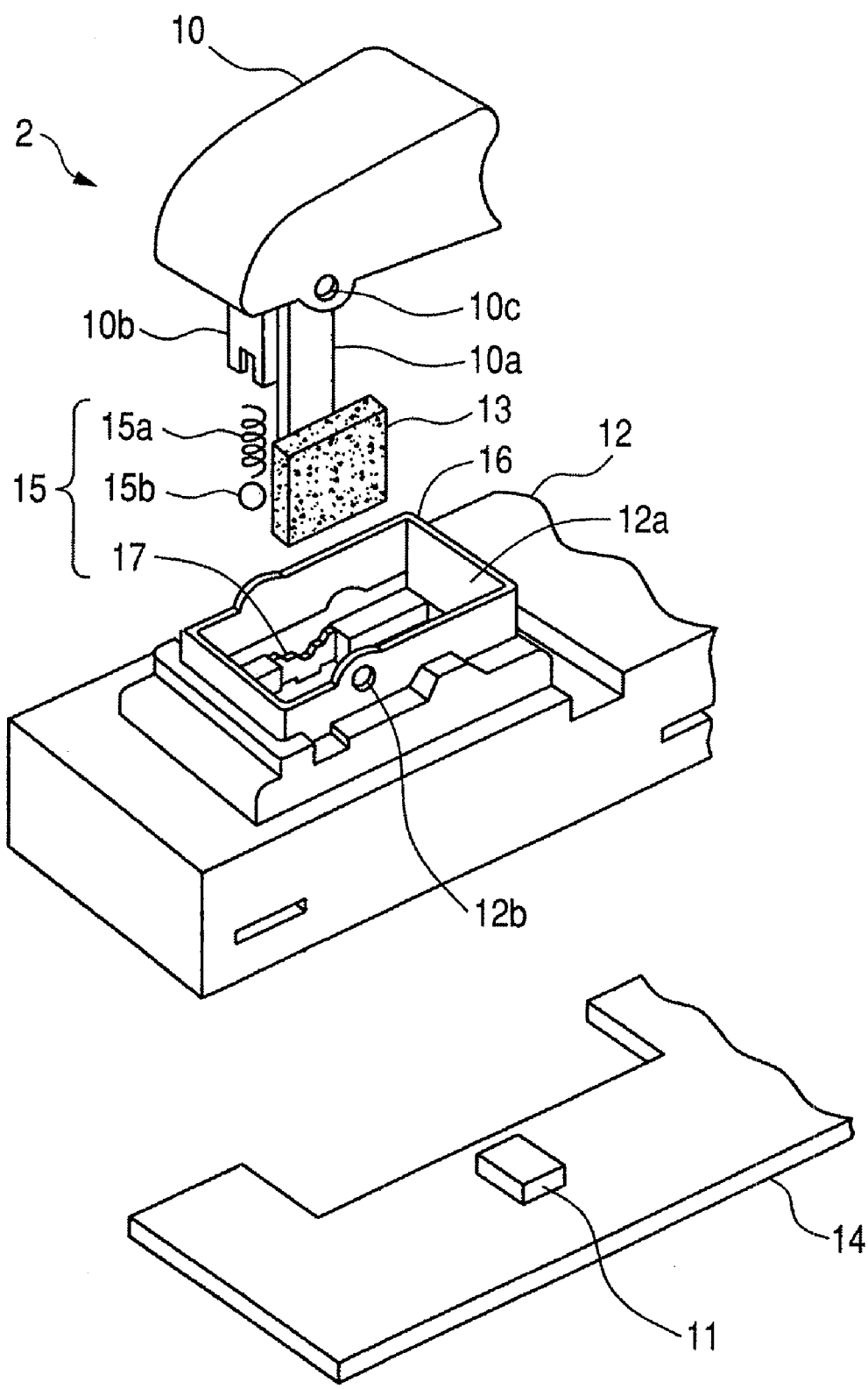
FIG. 2 is an exploded perspective view illustrating an electrical component.
Figure 3:
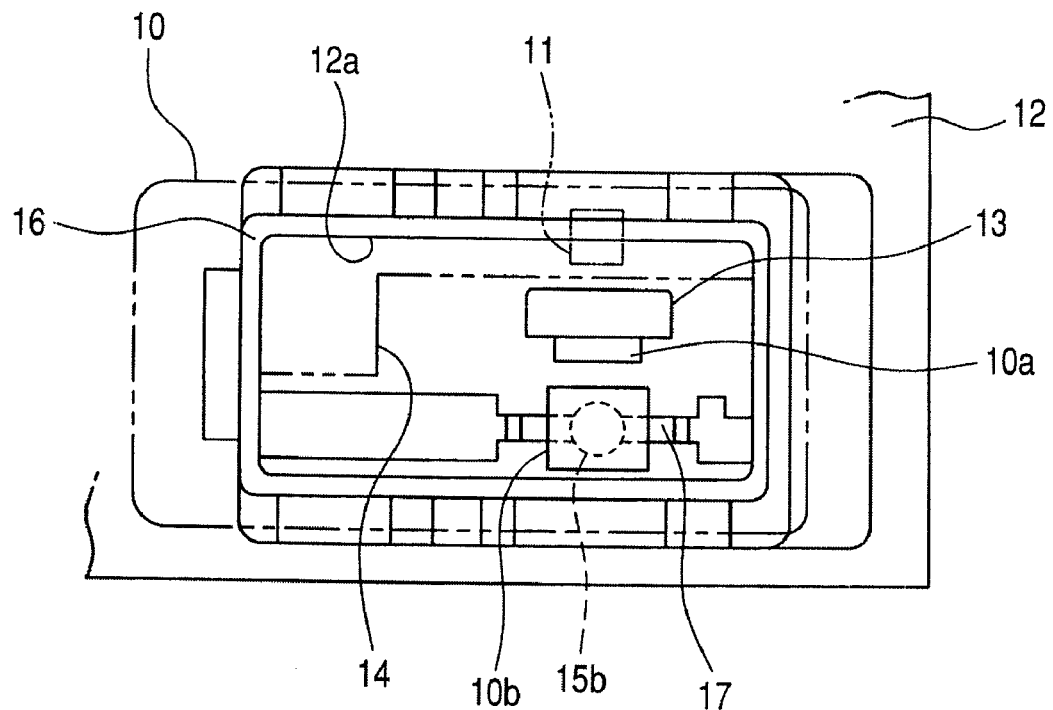
FIG. 3 is a diagram illustrating an inner structure of the electrical component.

Next, a detailed configuration of the electrical component 2 will be described. FIG. 2 shows an exploded perspective view of the electrical component 2, and FIG. 3 shows a diagram illustrating an inner structure of the electrical component 2. As shown in FIG. 2 and FIG. 3, the electrical component 2 schematically includes a case 12 having an opening 12a; an operating unit 10 mounted on the case 12 so as to be rocked; a plate-shaped permanent magnet 13 fixed under the operating unit 10 and moving along a plane perpendicular to a rotation axis of the operating unit 10; a printed board 14 on which a magnetoresistive element 11 is mounted and which is provided in the case 12; and a click mechanism 15 having a ball 15b and a spring 15a housed in a dropping pipe 10b of the operating unit 10.

The case 12 is provided with an integrally formed wall 16 to surround the opening 12a, and spindles 12b protrude at two parts of the outer wall surface of the wall 16. The case 12 is provided with a click cam surface 17 having a substantially V shape exposed into the opening 12a. The ball 15b capable of moving up and down in the dropping pipe 10b of the operating unit 10 is elastically urged by the spring 15a, thereby constantly coming into elastic contact with the click cam surface 17. The click mechanism 15 generating a click feeling according to the operation of the operating unit 10 is formed of the spring 15a, the ball 15b, and the click cam surface 17.

In the operating unit 10, a dropping piece 10a and the dropping pipe 10b protrude downward from the bottom, and shaft holes 10c are formed on the both side walls. The operating unit 10 is mounted to be rocked on the case 12 to cover the opening 12a by snapping the corresponding spindles 12b of the case 12 into the pair of shaft holes 10c. At the non-operating time, the ball 15b elastically urged to the spring 15a engages with a valley of the click cam surface 17, and the operating unit 10 is kept at the neutral position.

The operating unit 10 can be rocked in both directions using the spindles 12b as a rotation shaft by applying operation force against repulsive force of the spring 15a. The operating unit 10 can be rocked in one direction by pulling the operating unit 10 from the neutral position, and can be rocked in the other direction by pushing the operating unit 10 from the neutral position.

When the operating unit 10 is rocked, the dropping pipe 10b is inclined and thus the ball 15b is moved along the click cam surface 17. Corresponding to the operating unit 10 configured to be rocked in the both direction, the click cam surface 17 is also provided with inclined surfaces formed on both sides of the valley. In the click cam surface 17, two plat surfaces are formed on each of the both inclined surfaces. When the operating unit 10 is rocked in one direction from the neutral position, the ball 15b reaches the intermediate plat surface, thereby once generating a click feeling. When the operating unit 10 is further rocked in one direction, the ball 15b reaches the other plat surface at the rocked end position, thereby generating a click feeling again. When the operation force is removed from the rocked operating unit 10, the ball 15b is moved along the click cam surface 17 by the repulsive force of the spring 15a and engages with the valley of the cam surface 17 again. Accordingly, the operating unit 10 automatically returns to the original neutral position.

As described above, it is possible to generate the 2-step click feeling according to the operation of the operating unit 10 by the click mechanism 15. The click feeling is generated by engagement and separation between the ball 15b urged by the spring 15a and the click cam surface 17. The operating speed of the operating unit 10 at the click position is rapidly increased by moving the ball 15b to the valley along the inclined surface, and the position of the operating unit 10 is shifted momentarily (actually, for a short time).

Figure 4:
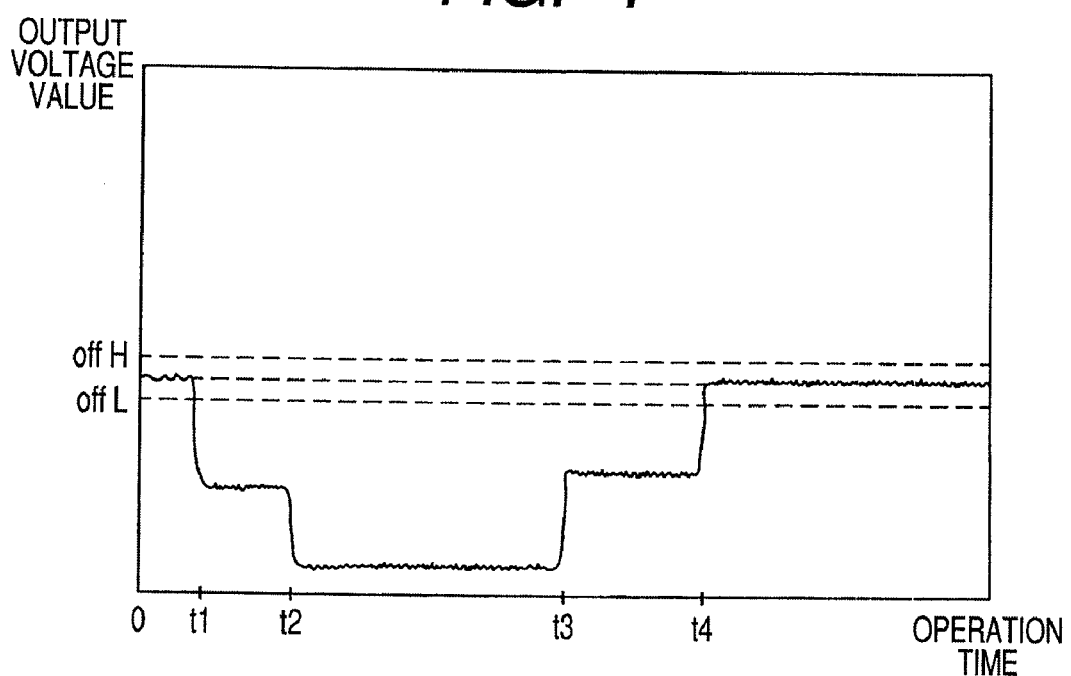
FIG. 4 is a diagram illustrating a relationship between operation time and output voltage value at the time of operating an operating unit.

FIG. 4 shows a diagram illustrating a relationship between an operating time and an output voltage value in the same state as a state where a user actually operates the operating unit 10 for the power window, that is, the operating unit 10 is not inserted up and down but the operating unit 10 is pushed by bringing the end of a finger into contact with the surface of the operating unit 10 or is pulled. FIG. 4 shows the relationship while the operating unit 10 is rocked in one direction from the neutral position, the two-step clink feeling is generated, the hand is put off, and the operating unit 10 returns to the neutral position. In FIG. 4, the time elapses from left to right.

At the time 0, the operating unit 10 is at the neutral position, and the corresponding output voltage value is output from the electrical component 2. With the lapse of time, the operating unit 10 is rocked in one direction, and is moved to the first-step click position at the time t1. From the time 0 to the time of moving to the first-step click position, the output voltage value is scarcely varied. On the contrary, the output voltage value is largely varied for a short time in the vicinity of the time t1 of moving to the first-click position. This variation is caused by the following reason: the operation speed of the operating unit 10 is rapidly increased at the click position as described above, the operating unit 10 is shifted, and thus the permanent magnet 13 operating integrally with the operating unit 10 is also shifted.

With the lapse of more time, the operating unit 10 is rocked in one direction, and is moved to the second-step position in the vicinity of the time t2. The output voltage value is scarcely varied, until the operating unit 10 is shifted in the vicinity of the time t1 and then is moved to the second-step click position. On the contrary, the output voltage value is largely varied for a short time in the vicinity of the time t2 when the operating unit 10 is moved to the second-step click position, as well as the first-step click time.

At the second-step click position, when the hand is detached from the operating unit 10 at the time t3, the operating unit 10 automatically returns to the neutral position. At this time, each of the output voltage values is largely varied for a short time at the first-step click position and the second-step click position. When the operating unit 10 returns to the neutral position, the output voltage value becomes the same value as the time 0.

Figure 5:
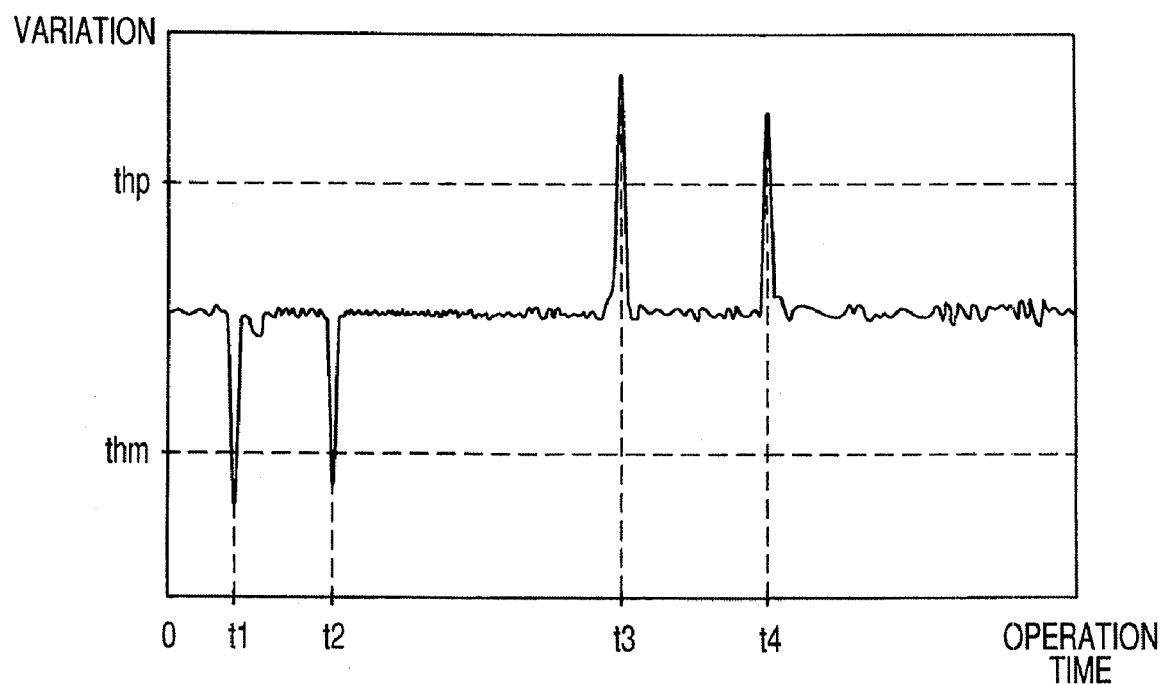
FIG. 5 is a diagram illustrating variation of the output voltage value in FIG. 4.

FIG. 5 shows variation of the output voltage value in FIG. 4. As shown in FIG. 5, since the output voltage value is largely varied at the time of generating a click feeling at which the operating unit 10 is shifted, the variation of the output voltage value at the time becomes very large. The detecting unit 3 of the switch device 1 detects the variation of the output voltage value from the electrical component 2. When the absolute value of the variation becomes a predetermined threshold value or more, the detecting unit 3 determines that variation per time becomes a predetermined value or more and considers that the operating unit 10 is operated to the click position, thereby outputting a signal based thereon. In addition, the inclination angle and the variation characteristics are an output of a sine wave similarly with a magnetic variable resistor using a general permanent magnet and magentoresistor. The threshold value is set from the result obtained by acquiring data of an actual product.

Figure 6:
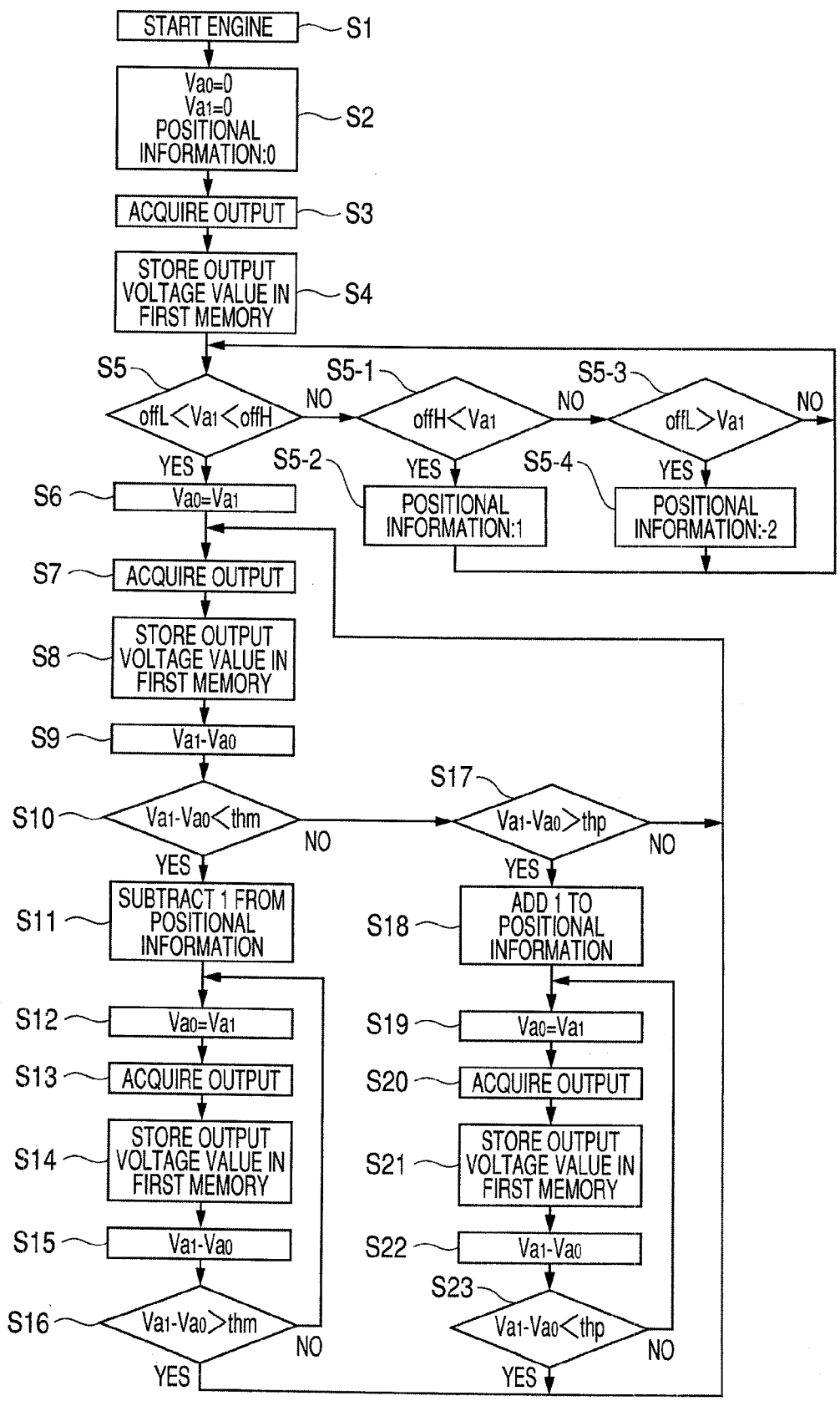
FIG. 6 is a flowchart in a detecting unit.

FIG. 6 shows a flowchart in the detecting unit 3. An engine of a vehicle is started up, thereby starting a flow (S1). The detecting unit 3 initializes the first memory 5 (S2). Specifically, output voltage values Va0 and Va1 from the electrical component 2 are set to 0, and positional information of the operating unit 10 is set to 0 representing the neutral position.

Herein, Va represents the output voltage value acquired from the electrical component 2, and the data is acquired at a sufficiently short predetermined time interval. Va1 is the latest value of Va, and Va0 is a former value by 1 step, that is data acquired at the measurement time before measuring Va1. That is, the values are used as the output voltage values acquired at different times to calculate the variation of the output voltage values. In the positional information of the operating unit 10, the neutral position is 0, the position pushed to the first-step click position is −1, the position pushed to the second-step click position is −2, the position pulled to the first-step click position is 1, and the position pulled to the second-step click position is 2.

Then, the detecting unit 3 acquires the output voltage value from the electrical component 2 (S3), and the output voltage value is stored as Va1 in the first memory 5 (S4). Subsequently, the detecting unit 3 reads two values (offL, offH) from the second memory 6, and compares them with Va1. The offL and offH are slightly smaller value and larger value than the output voltage value from the electrical component 2 when the operating unit 10 is at the neutral position as shown in FIG. 4, and are used to determine whether or not the operating unit 10 is operated in the initial state.

When Va1 is larger than offL and smaller than offH, the operating unit 10 is at the neutral position and the steps after S6 proceed. When Va1 is smaller than offL or larger than offH, the operating unit 10 is operated in any one direction and the steps after S5-1 proceed.

When Va1 is larger than offH (S5-1), it is determined that the operating unit 10 is pulled and the detecting unit 3 transmits the positional information of the operating unit 10 as 1 to the vehicle control unit 30 (S5-2) In this case, it is not determined whether the operating unit 10 is at the first-step click position or the second-step click position, and the positional information corresponding to the first-step click position is transmitted in any case. The vehicle control unit 30 receiving the positional information instructs the window device 20 to perform a manual operation in a direction of raising the window 21. The operation of pulling the operating unit 10 is an operation in a direction of closing the window 21. Even when an unintended operation is performed at the time of starting the engine by performing only the manual operation, finger or the like is prevented from being caught between the window and window frame. Accordingly, it is possible to perform an adequate operation considering safety.

When Va1 is smaller than offL (S5-3), it is determined that the operating unit 10 is pushed and the detecting unit 3 transmits the positional information of the operating unit 10 as −2 to the vehicle control unit 30 (S5-4). Also in this case, it is not determined whether the operating unit 10 is at the first-step click position or the second-step click position, and the positional information corresponding to the second-step click position is transmitted in any case. The vehicle control unit 30 receiving the positional information instructs the window device 20 to perform an automatic operation in a direction of descending the window 21.

In S5, when it is determined that the operating unit 10 is at the neutral position, the detecting unit 3 changes Va0 to the value of Va1 (S6), acquires the output voltage value from the electrical component 2 (S7), and stores the output voltage value as Va1 in the first memory 5 (S8). The detecting unit 3 calculates Va1-Va0 (S9), and determines whether or not the calculated value is larger than the threshold value previously stored in the second memory 6 (S10). In S10, it is determined whether or not Va1-Va0 is smaller than thm. The thm is a threshold value having a negative value. When Va1-Va0 is smaller than thm, it can be considered that the variation of the output voltage value is large in the direction of pushing the operating unit 10, that is, the operating unit 10 is moved downward to be at any one click position.

Accordingly, in S10, when Va1-Va0 is smaller than thm, the detecting unit 3 subtracts 1 from the positional information of the operating unit 10 stored in the first memory 5. The detecting unit 3 stores the result of the subtraction in the first memory 5 and transmits the result of the subtraction to the vehicle control unit 30 (S11). For example, when the positional information before S10 is 0, that is, the operating unit 10 is at the neutral position, the positional information becomes −1 in S11 and it can be considered that the operating unit 10 is at the first-step click position in the pushing direction.

When the positional information is calculated and transmitted in S11, the detecting unit 3 changes Va0 to the value of Va1 (S12). Then the detecting unit 3 acquires the output voltage value from the electrical component 2 (S13), and stores the output voltage value as Va1 in the first memory 5 (S14). Subsequently, the detecting unit 3 calculates Va1-Va0 (S15), and compares Va1-Va0 with thm (S16). Then, S12 to S16 are repeated until Va1-Va0 is larger than thm.

The variation of the output voltage value is largely changed in a pulse shape at the click position of the operating unit 10 as shown in FIG. 5. According to the step S12 to S16, the positional information of the operating unit 10 is not changed while Va1-Va0 is within the pulse shown in FIG. 5.

In S10, when Va1-Va0 is larger than thm, it is determined whether or not Va1-Va0 is larger than thp (S17). The thp is a threshold value having a positive value. When Va1-Va0 is larger than thp, it can be considered that the variation of the output voltage value is large in the direction of pulling the operating unit 10, that is, the operating unit 10 is moved upward to be at any one click position.

Accordingly, in S17, when Va1-Va0 is larger than thp, the detecting unit 3 adds 1 to the positional information of the operating unit 10 stored in the first memory 5. The detecting unit 3 stores the result of the addition in the first memory 5 and transmits the result of the addition to the vehicle control unit 30 (S18). For example, when the positional information before S17 is 1, that is, the operating unit 10 is at the first-step click position in the pulling direction, the positional information becomes 2 in S18 and it can be considered that the operating unit 10 is at the second-step click position in the pulling direction.

Hereinafter, the steps S19 to S23 are performed in the same operation as the steps S12 to S16, and the positional information of the operating unit 10 is not changed while Va1-Va0 is within the pulse shown in FIG. 5.

In S10 and S17, when Va1-Va0 is larger than thm and is smaller than thp, the operating unit 10 does not reach the click position and the process returns to the step S7. After the step S16 or S23, the process returns to the step S7 and the steps after S7 are repeated.

As described above, a predetermined signal is output according to the variation of the output voltage value from the electrical component 2. Accordingly, even when the characteristic of the output voltage value with respect to the position of the operating unit 10 is changed by the individual deviation of the switch device 1 or the variation in temperature, it is possible to synchronize the time of outputting a signal and the time of generating a click feeling.

When a predetermined signal is output according to the variation of the output voltage value from the electrical component 2, it is possible to detect only the relative positional variation with respect to the latest state. Accordingly, as shown in the step S5, the position of the operating unit 10 in the initial state of starting the operation is determined using the output voltage value from the electrical component 2. Therefore, it is possible to further securely determine the position of the operating unit 10.

The embodiment of the invention has been described above, but the invention is not limited to the embodiment and variously applied within the scope of the technical concept. For example, in the embodiment, the two-step click position is set for each of the directions of pulling and pushing the operating unit 10, but one-step click position may be set for each.

To calculate the variation of the output voltage value, the difference from the latest detected output voltage value is calculated. However, the latest two or more output voltage values may be stored in the first memory 5, and the difference between the average value of the two or more output voltage values and the acquired output voltage value may be calculated. In this case, there is an advantage of reducing an influence caused by noise. In the embodiment, the data is acquired at a predetermined time internal, and the variation per time is detected by comparing only the data. However, time may be measured to detect the variation per time. In addition, the output of the magnetoresistive element may be input to a differential circuit to calculate the variation, and it may be determined whether or not the value exceeds a predetermined threshold value. The variation of the output voltage value may be calculated by various methods.

In the embodiment, the permanent magnet and the magnetoresistive element are used as the electrical component 2, but a variable resistor using a resistor and a wiper may be used. In the embodiment, the click mechanism 15 is formed by the spring 15a, the ball 15b, and the click cam surface 17 having the substantially V-shaped inclined surface, but a plate spring may be provided with a protrusion, and the protrusion may be inserted to the click cam surface. In addition, it is not necessary to form the inclined surface on the cam surface, and the inclined surface may be provided on the convex side inserted thereto. In other words, in a click mechanism generating a click feeling by unevenness engagement, the inclined surface may be formed on any one side. When a click feeling is generated by absorption of a magnet, a speed of an operation member is rapidly changed at that part. Accordingly, the invention may be applied to such a type. In addition, the invention may be applied to a case where a distance of a permanent magnet and a magnetoresistive element is changed at a click position and thus the output is changed, as well as the speed of the operating member in the moving direction is rapidly changed. The main point is that the invention may be applied to the case where the output value is rapidly changed by the click mechanism.

What is claimed is:

1. A switch device comprising:
   an electrical component having an operating unit and outputting a predetermined analog signal based on a position of the operating unit; and
   a detecting unit that detects operation of the operating unit on the basis of an output from the electrical component,
   wherein the electrical component is provided with a click mechanism that generates a click feeling at a predetermined position with respect to the operation of the operating unit, and the click mechanism shifts the operating unit while changing an operating speed at the predetermined position, and
   wherein the detecting unit detects variation of a signal converted from the predetermined analog signal into a digital signal in output from the electrical component, and outputs a predetermined signal on the basis of the variation in output by considering that the operating unit is at a predetermined position for generating the click feeling.

2. The switch device according to claim 1, wherein the detecting unit outputs a predetermined signal by considering that the operating unit is at a predetermined position for generating the click feeling, when the variation in output from the electrical component becomes greater than a predetermined threshold value.

3. The switch device according to claim 1, wherein the detecting unit detects an output from the electrical component in an initial state of starting an operation, and outputs a predetermined signal based on the output.

4. The switch device according to claim 1, wherein the electrical component includes a permanent magnet and a magnetoresistive element, wherein the magnetoresistive element outputs the predetermined analog signal.

5. The switch device according to claim 1, wherein the detecting unit outputs a predetermined signal by considering that the operating unit is at a predetermined position for generating the click feeling, when the variation in output from the electrical component becomes less than a predetermined threshold value.

* * * * *